(12) United States Patent
Kim

(10) Patent No.: US 7,609,680 B2
(45) Date of Patent: Oct. 27, 2009

(54) HARQ DEVICE AND METHOD FOR MOBILE COMMUNICATION SYSTEM

(75) Inventor: Min-Koo Kim, Suwon-shi (KR)

(73) Assignee: Samsung Electronics Co., Ltd (KR)

(*) Notice: Subject to any disclaimer, the term of this patent is extended or adjusted under 35 U.S.C. 154(b) by 707 days.

(21) Appl. No.: 11/209,220

(22) Filed: Aug. 23, 2005

(65) Prior Publication Data
US 2005/0289434 A1 Dec. 29, 2005

Related U.S. Application Data

(62) Division of application No. 09/986,236, filed on Oct. 22, 2001, now Pat. No. 7,099,298.

(30) Foreign Application Priority Data
Oct. 21, 2000 (KR) .............................. 2000-62155

(51) Int. Cl.
*H04B 7/216* (2006.01)
(52) U.S. Cl. ...................... 370/342; 370/335
(58) Field of Classification Search ............... 714/751, 714/764, 774, 779, 749–752, 724, 38, 48; 370/335, 342; 375/240, 260, 335, 352, 347, 375/394, 399, 422, 340, 377, 220, 295
See application file for complete search history.

(56) References Cited

U.S. PATENT DOCUMENTS

| | | | |
|---|---|---|---|
| 5,023,869 A | 6/1991 | Grover et al. | |
| 5,636,209 A | 6/1997 | Perlman | |
| 6,026,079 A | 2/2000 | Perlman | |
| 6,134,590 A | 10/2000 | Perlman | |
| 6,704,898 B1* | 3/2004 | Furuskar et al. | 714/751 |
| 6,877,130 B2 | 4/2005 | Kim et al. | |
| 7,185,257 B2* | 2/2007 | Kim et al. | 714/751 |
| 7,366,272 B2* | 4/2008 | Kim et al. | 375/377 |
| 2002/0103953 A1 | 8/2002 | Das et al. | |
| 2004/0114549 A1 | 6/2004 | Miyoshi | |
| 2005/0283701 A1* | 12/2005 | Kim | 714/748 |

OTHER PUBLICATIONS

Kim M.G. and Ha S.H; "Quasi-complementary turbo codes (QCTC) for applications in high-data-rate systems." Vehicular Technology Conference, 2003. VTC 2003-Spring. The 57th IEEE Semiannual, Apr. 22-25, 2003, V. 4, p. 2381-2385.*

* cited by examiner

*Primary Examiner*—Thai D Hoang
(74) *Attorney, Agent, or Firm*—The Farrell Law Firm, LLP

(57) ABSTRACT

There is provided a device and method for retransmitting error-detected data in a mobile communication system. A transmitter generates S sub-codes $C_i$ ($i=0, 1, 2, \ldots, S-1$) from a physical layer packet (PLP) information stream using quasi-complementary turbo codes, initially transmits the first sub-code $C_0$, and then sequentially transmits the following sub-codes each time a retransmission request is received for the initial transmission or a previous retransmission. Upon receipt of a retransmission request for the last sub-code $C_{S-1}$, the transmitter transmits the first sub-code $C_0$ and then sequentially transmits the following sub-codes each time a retransmission request is received.

1 Claim, 11 Drawing Sheets

HARQ DEVICE AND METHOD FOR MOBILE COMMUNICATION SYSTEM

PRIORITY

This application is a Divisional application of U.S. application Ser. No. 09/986,236, filed Oct. 22, 2001 now U.S. Pat. No. 7,099,298, which claims priority to an application entitled "HARQ Device and Method for Mobile Communication System" filed in the Korean Industrial Property Office on Oct. 21, 2000 and assigned Serial No. 2000-62155, the contents of which are incorporated herein by reference.

BACKGROUND OF THE INVENTION

1. Field of the Invention

The present invention relates generally to a data transmitting device and method, and in particular, to a device and method for retransmitting data that has errors during transmission.

2. Description of the Related Art

For forward packet data transmission in a mobile communication system, a mobile station is assigned a forward dedicated channel (DCH) from a base station. Mobile communication systems as mentioned below cover satellite systems, ISDN, digital cellular systems, W-CDMA, UMTS, and IMT-2000. Upon receipt of the forward packet data, the mobile station determines whether the reception is successful, and if it is, the mobile station transmits the packet data to its higher layer. On the other hand, if errors are detected from the packet data, the mobile station requests its retransmission by HARQ (Hybrid Automatic Repeat Request). The HARQ is a retransmission scheme using both FEC (Forward Error Correction) and ARQ (Automatic Repeat Request) for requesting retransmission of an error-detected data packet. It increases transmission throughput and improves system performance by channel coding for error correction. The main channel coding methods are convolutional coding and turbo coding.

Meanwhile, an HARQ system uses soft combining to increase throughput. There are two types of soft combining: packet diversity combining and packet code combining. These are also referred to as soft packet combining. Despite being sub-optimal in terms of performance relative to packet code combining, packet diversity combining is widely used when performance loss is low due to its simple implementation.

A packet transmission system uses the packet code combining scheme to improve transmission throughput. A transmitter transmits a code with a different data rate at each packet transmission. If an error is detected from the received packet, a receiver requests a retransmission and performs soft combining between the packet and a retransmitted packet. The retransmitted packet may have a different code from that of the previous packet. The packet code combining scheme is a process of combining received N packets with a code rate R to a code with an effective code rate of R/N prior to decoding, to thereby obtain a coding gain.

With regard to the packet diversity combining scheme, on the other hand, the transmitter transmits a code with the same code rate R at each packet transmission. If an error is detected from the received packet, the receiver requests a retransmission and performs soft combining between the packet and the retransmitted packet. The retransmitted packet has an identical code to that of the previous packet. In this sense, the packet diversity combining scheme can be considered symbol averaging on a random channel. The packet diversity combining scheme reduces noise power by averaging the soft outputs of input symbols and achieves such a diversity gain as offered by a multipath channel because the same code is repeatedly transmitted on a fading channel. However, the packet diversity combining scheme does not provide such an additional coding gain as obtained according to a code structure in the packet code combining scheme.

Due to implementation simplicity, most packet communication systems have used the packet diversity combining scheme, which is under study for application to the synchronous IS-2000 system and the asynchronous UMTS system. The reason is that the existing packet communication systems have used convolutional codes and even packet code combining does not offer a great gain when convolutional codes with a low data rate are used. If a system with R=1/3 supports retransmission, there is not a wide difference in performance between packet code combining and packet diversity combining. Thus, the packet diversity combining scheme is selected considering implementation complexity. However, use of turbo codes as FEC codes requires a different packet combining mechanism because the turbo codes are designed as error correction codes to have performance very close to the "Shannon Channel Capacity Limit" and their performance varies obviously with the coding rates unlike convolutional codes. Therefore, it can be concluded that packet code combining scheme is feasible for a packet communication system using turbo codes in a retransmission scheme to achieve the goal of optimum performance.

SUMMARY OF THE INVENTION

It is, therefore, an object of the present invention to provide a device and method for generating sub-codes for optimal code combining and applying the sub-codes to an HARQ scheme in a retransmission system using turbo codes.

It is another object of the present invention to provide a device and method for generating complementary codes from turbo codes and applying the complementary codes to an HARQ scheme in a communication system.

It is a further object of the present invention to provide a device and method for performing diversity combining and code combining selectively on retransmitted sub-codes in a mobile communication system.

It is still another object of the present invention to provide a device and method for performing code combining on initially transmitted sub-codes and performing diversity combining and code combining selectively on retransmitted sub-codes.

The foregoing and other objects can be achieved by providing a device and method for retransmitting error-detected data in a mobile communication system. A transmitter generates S sub-codes $C_i$ (i=0, 1, 2, . . . , S−1) from a physical layer packet (PLP) information stream using quasi-complementary turbo codes, initially transmits the first sub-code $C_0$, and then sequentially transmits the following sub-codes each time a retransmission request is received for the initial transmission or a previous retransmission. Upon receipt of a retransmission request for the last sub-code $C_{S-1}$, the transmitter transmits the first sub-code $C_0$ and then sequentially transmits the following sub-codes each time a retransmission request is received.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENTS

Preferred embodiments of the present invention will be described hereinbelow with reference to the accompanying drawings. In the following description, well-known functions or constructions are not described in detail since they would obscure the invention in unnecessary detail.

1. Packet Code Combining

The present invention proposes a method of generating sub-codes for optimal packet combining in a retransmission system using turbo codes and a system that selectively employs a packet code combining scheme and a packet diversity combining scheme according to the data rates. The advantages and performance gain of the proposed system and an HARQ protocol for operating the system will be described.

First, there will be given a description of the operation of the system that selectively uses the packet code combining scheme and the packet diversity scheme combining according to the data rates.

In a system using R=1/5 turbo codes, for example, packet code combining applies until the overall code rate of codes produced by soft-combining of retransmitted packets reaches 1/5. For the subsequent retransmitted packets, packet diversity combining and then packet code combining are performed. If the first packet is transmitted at a data rate of 1/3, the required redundancy symbols are provided at a retransmission request to make the overall code rate 1/5. Thus, when a receiver receives both packets, the overall code rate becomes 1/5. Each of the following packets is repeated prior to transmission and the receiver performs packet diversity combining and then packet code combining on the retransmitted packets at the data rate 1/5.

It is generally known that there is not a wide performance difference between the packet diversity combining scheme and the packet code combining scheme for convolutional codes with a low data rate. However, there is an obvious difference between them for turbo codes, unlike convolutional codes. The packet code combining scheme offers a greater performance gain for the turbo codes than the packet diversity combining scheme. In view of the above-described nature of the turbo codes, HARQ Type II/III using turbo codes can improve throughput markedly.

Figure 1:
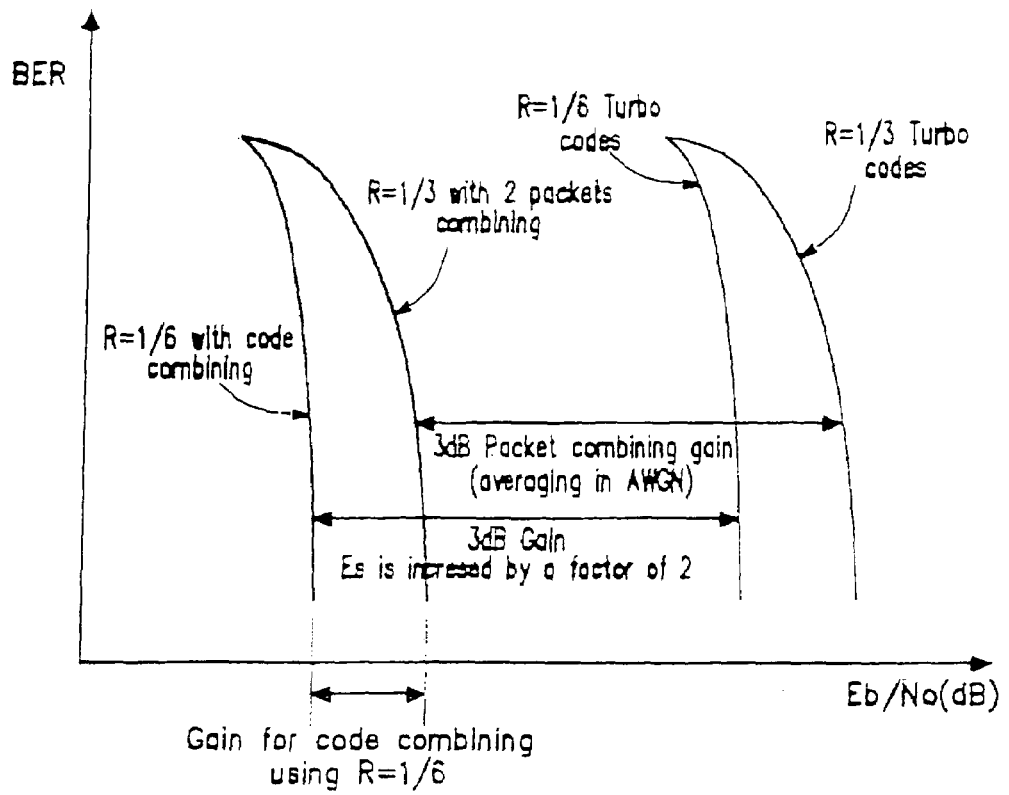
FIG. 1 is a graph showing the performance difference between packet code combining and packet diversity combining in a packet data system using turbo codes.

FIG. 1 is a graph showing the performance difference between packet code combining and packet diversity combining in the case of turbo codes. As shown in FIG. 1, a turbo code with a low data rate of 1/6 exhibits a greater performance gain than a turbo code with a high code rate of 1/3 with the same symbol energy Es and obtains a performance gain of 3 dB from packet code combining. Consequently, generation of R=1/3 turbo codes by packet code combining of R=1/6 sub-codes produces a gain that turbo codes with a data rate lower than 1/3 exhibits and a gain that code combining of different codes offers, contemporaneously.

More specifically, for the same code symbol energy Es and the same given code rate, turbo codes provide performance close to the "Shannon Channel Capacity Limit" according to the code rates only if iteration decoding is filly implemented, unlike convolutional codes. It is known that a turbo code with a low code rate offers a greater performance gain than a turbo code with a high code rate with the same code symbol energy Es. For example, when R=1/3 is reduced to R=1/6, the performance difference can be estimated by analyzing a change in the "Shannon Channel Capacity Limit". The reason for assuming the same symbol energy irrespective of R=1/3 or 1/6 for the curves of FIG. 1 is that the same symbol energy Es is used for each retransmission in an HARQ system, as compared to a conventional analysis of the performance of turbo codes by checking the decrease of symbol energy caused by reduced code rates.

If an R=1/2 code is repeated once and the two codes are packet-diversity-combined on an AWGN (Additive White Gaussian Noise) channel, a maximum gain of 3 dB is obtained in terms of a symbol energy-to-noise ratio (Es/No). The same is the case with an R=1/6 code. Thus, a performance curve for the R=1/3 turbo code shifts to the left in parallel by a +3 dB scale due to a packet diversity combining gain and a performance curve for the R=1/6 turbo code also shifts to the left in parallel by a +3 dB scale when the same symbol energy is given. Here, the performance curves are derived with respect to the energy-to-noise ratio (Eb/No) which is measured to compare code performances according to the code rates. As a consequence, the difference between the turbo code performance curves is equivalent to the performance difference between packet diversity combining and packet code combining. The performance difference according to the code rates can be estimated from the "Shannon Channel Capacity Limit" and a minimum performance difference can be obtained using a minimum required signal-to-noise ratio (SNR).

2. Minimum Required Eb/No for Code Rates

In a system using turbo codes with a code rate R and a very large encoder block size L, a minimum Eb/No required to provide an error-free channel is expressed as $$Eb/No \rangle (4^R-1)/2R \qquad (1)$$

According to the above equation, the minimum required Eb/No in AWGN at each code rate for the turbo codes is listed in Table 1 below. In Table 1, a typical Eb/No indicates a required Eb/No for a bit error rate (BER) below 0.00001 when the encoding block size L of the turbo codes is 1024.

TABLE 1

| Code rates | Required Eb/No (dB) | Typical Eb/No (dB) for BER = $10^{-5}$ |
|---|---|---|
| 3/4 | 0.86 | 3.310 |
| 2/3 | 0.57 | 2.625 |
| 1/2 | 0.00 | 1.682 |
| 3/8 | −0.414 | 1.202 |
| 1/3 | −0.55 | 0.975 |
| 1/4 | −0.82 | 0.756 |
| 1/5 | −0.975 | 0.626 |
| 1/6 | −1.084 | 0.525 |
| 0 | −1.62 | NA |

As shown in Table 1, required Eb/No are 0.86, 0.57, 0.0, −0.414, −0.55, −0.82, −0.975, and −1.084 dB respectively, for the code rates of 3/4, 2/3, 1/2, 3/8, 1/3, 1/4, 1/5, and 1/6. An at least 0.53 dB performance difference exists between an R=1/3 code using system and an R=1/6 code using system. This is a minimum performance difference based on the "Shannon Channel Capacity Limit". Considering implementation of a real decoder and system environment, the difference becomes wider. From a simulation, an approximately 1.12 dB performance difference was observed between a system using packet code combining for R=2/3 codes and a system using packet diversity combining for the R=2/3 codes.

Table 2 shows the performance difference between packet code combining and packet diversity combining after one retransmission in a system with a sub-code code rate of 2/3. As shown in Table 2, a minimum performance difference is 1.12 dB and the packet code combining scheme produces a higher performance gain in the turbo code-using system.

TABLE 2

| Items | Packet combining | Code combining |
|---|---|---|
| Mother code rate $R_m$ | 1/3 (X, Y0, Y'0) in FIG. 1 | 1/3 (X, Y0, Y'0) in FIG. 1 |
| Block size (L) | 496 | 496 |
| Maximum number of iterations | 8 | 8 |
| Number of transmissions | 2 | 2 |
| Actual Tx code rate Re for each transmission | 2/3 (by puncturing) See section 2 | 2/3 (by puncturing) See section 3 |
| Redundancy selection | Identical pattern for all transmissions. | Different pattern for all transmissions. |
| Soft combining | Packet diversity combining | Packet code combining |
| Gain through retransmissions | Symbol repetition gain | Coding gain for low rate codes |
| Minimum required Eb/No in Table 3 | +0.57 (dB) | R-2/3 +0.57 (dB) R-2/6 −0.55 (dB) |
| Required Eb/No at 2nd retransmissions | +0.57-3.0 (dB) | −0.55-3.0 (dB) |
| Relative performance gain | 0 | 1.12 (=0.57 + 0.55) dB |
| Simulated relative gain (@ BER = $10^{-5}$) | 0 | 2.5 (dB) |

As described above, the packet code combining scheme shows excellent performance in the turbo code-using retransmission system. Therefore, the present invention provides a sub-code generating method for optimal packet code combining in a turbo code-using retransmission system. Generation of sub-codes for packet code combining according to a predetermined rule produces the aforementioned code combining gain and maximizes the performance of a system requesting sub-codes of the same size for each retransmission.

Figure 2:
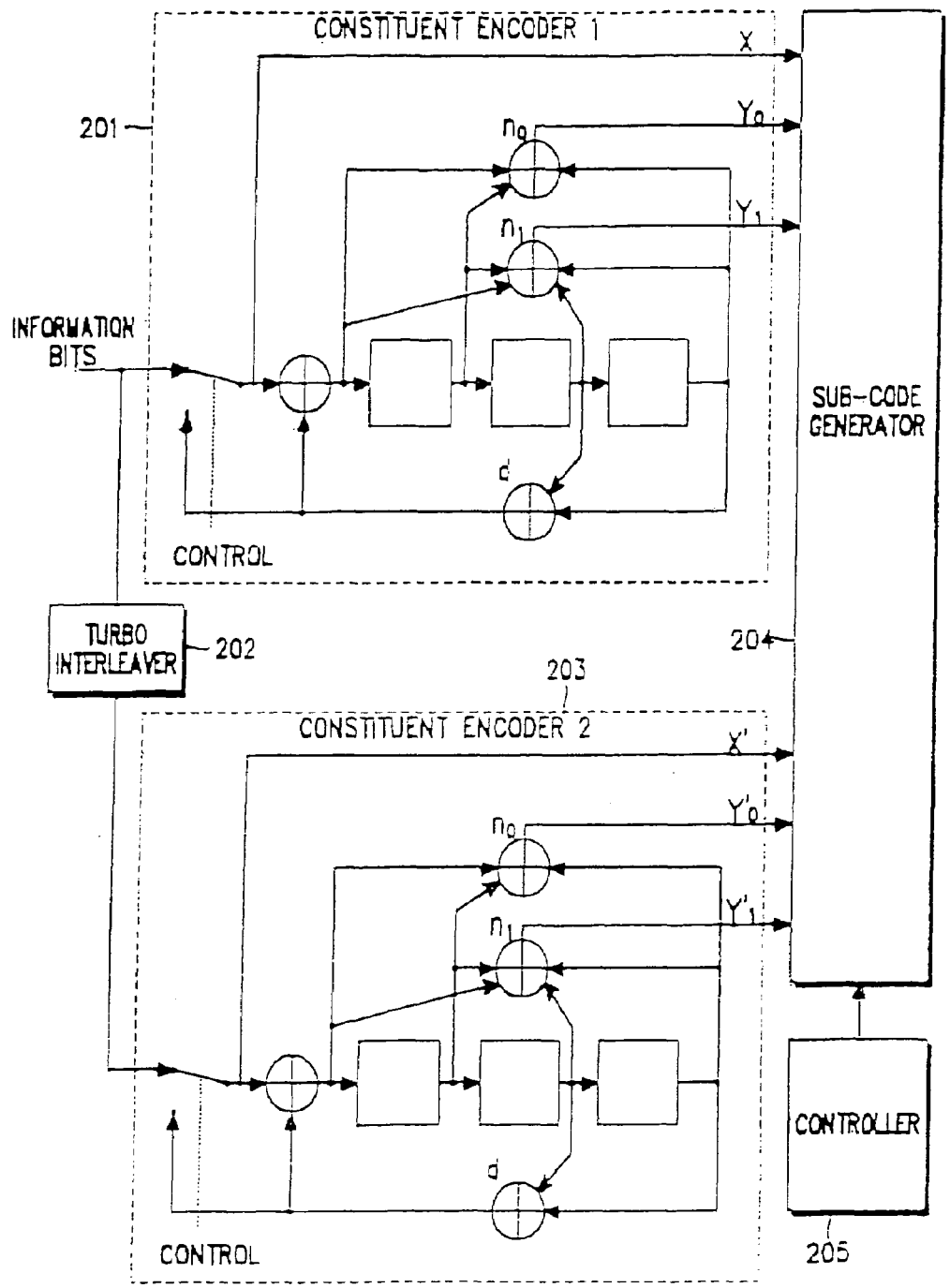
FIG. 2 is a block diagram of a sub-code generating apparatus according to an embodiment of the present invention.

FIG. 2 is a block diagram of a sub-code generating apparatus using turbo codes according to an embodiment of the present invention. As shown in FIG. 2, the sub-code generating apparatus includes a turbo encoder, a sub-code generator 204, and a controller 205.

First, with regard to the turbo encoder, a first component encoder (or a first constituent encoder) 201 encodes an input information bit stream and outputs first code symbols, i.e., information symbols X and first parity symbols Y0 and Y1. An interleaver 202 interleaves the input information bit stream according to a predetermined rule. A second component encoder (or a second constituent encoder) 203 encodes the interleaved information bit stream and outputs second code symbols, i.e., information symbols X' and second parity symbols Y'0 and Y'1. Thus, the output symbols of the turbo encoder are the first and second code symbols. Since the information symbols X' generated from the second component encoder 203 are not transmitted in reality, the code rate of the turbo encoder is 1/5.

The sub-code generator 204 generates sub-codes from the first and second code symbols received from the first and second component encoders 201 and 203 by puncturing and repetition under the control of the controller 205. The controller 205 stores puncturing (and repetition) matrixes generated from algorithms shown in FIGS. 4, 5 and 6 and outputs symbol selection signals for the puncturing matrixes to the sub-code generator 204. Then, the sub-code generator 204 selects a predetermined number of code symbols within a predetermined puncturing range according to the symbol selection signals.

The reference characters as used here, X, Y0, Y1, Y'0, and Y'1 are defined as follows.

Figure 7:
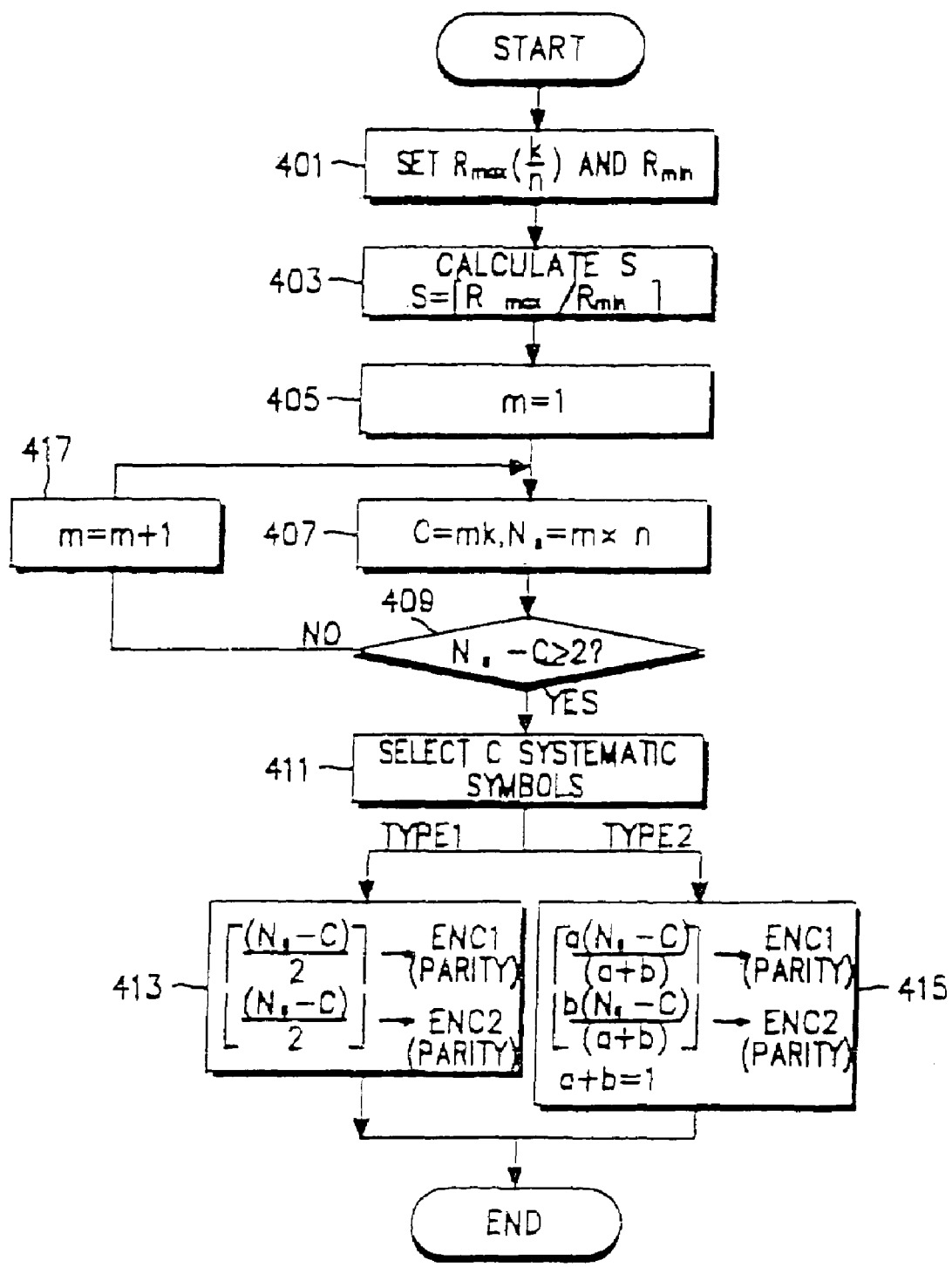
FIG. 7 is a flowchart illustrating a method of generating the first sub-code in the sub-code set of quasi-complementary turbo codes (QCTCs) according to an embodiment of the present invention.
Figure 8:
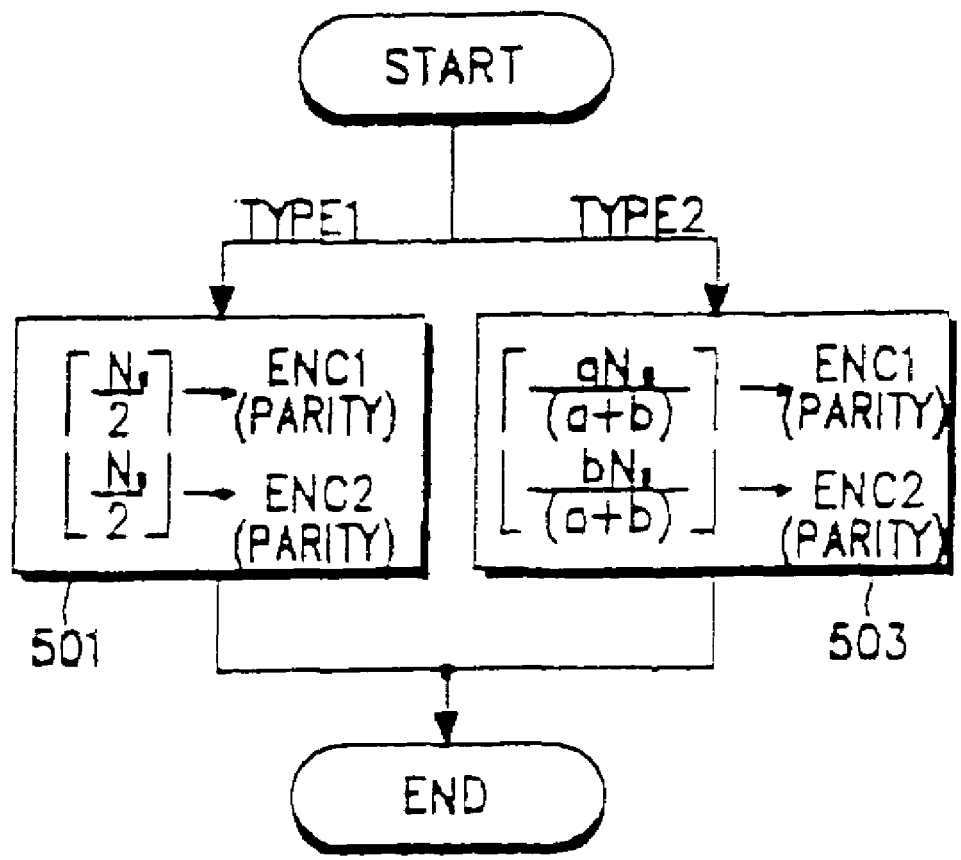
FIG. 8 is a flowchart illustrating a method of generating middle sub-codes in the sub-code set of the QCTCs according to the embodiment of the present invention.
Figure 9:
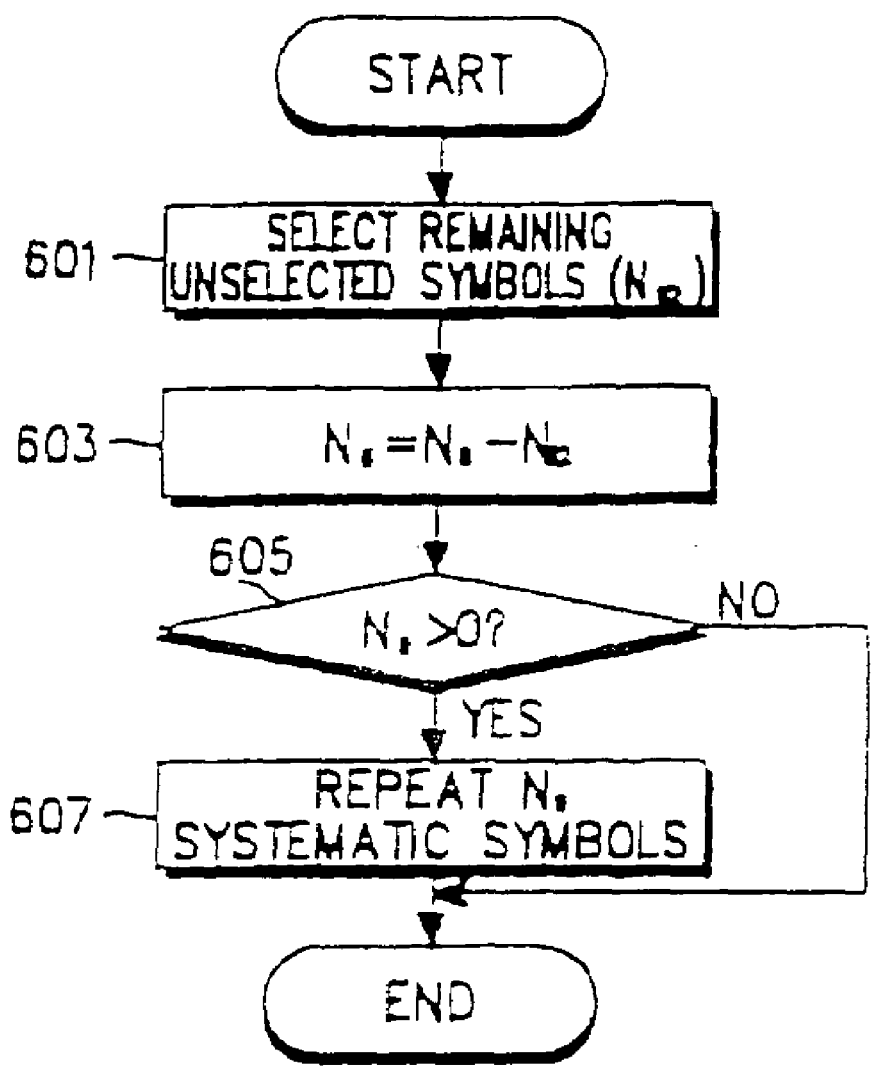
FIG. 9 is a flowchart illustrating a method of generating the last sub-code in the sub-code set of the QCTCs according to the embodiment of the present invention.

X'1: systematic code symbol or information symbol X: systematic code symbol or information symbol Y0: redundancy symbol from the upper component encoder of the turbo encoder Y1: redundancy symbol from the upper component encoder of the turbo encoder Y'0: redundancy symbol from the lower component encoder of the turbo encoder Y'1: redundancy symbol from the lower component encoder of the turbo encoder FIGS. 7, 8 and 9 are flowcharts illustrating sub-code (or puncturing matrix) generating procedures according to the embodiment of the present invention. Specifically, FIG. 7 illustrates a procedure of generating the first sub-code $C_0$ in a sub-code set, FIG. 8 illustrates a procedure of generating middle sub-codes $C_1$ to $C_{s-2}$ in the sub-code set, and FIG. 9 illustrates a procedure of generating the last sub-code $C_{s-1}$ in the sub-code set.

Hereinbelow, ENC1 (referred to as first code symbols) indicate the information symbols X and the first parity symbols Y0 and Y1 output from the first component encoder 201 and ENC2 (referred to as second code symbols) indicate the second parity symbols Y'0 and Y'1 output from the second component encoder 203.

Referring to FIG. 7, a maximum code rate (Rmax) available to a transmitter is set in step 401. This value is mostly given according to the data rate used in the system. A minimum code rate (Rmin) is set to be an integer-multiple of Rmax (=k/n). Although Rmin can be determined arbitrarily, it is usually 1/6, 1/7, or lower because a coding gain is saturated due to the decrease of code rates at or below R=1/7 in turbo codes. In addition, the real code rate, i.e., mother code rate (R) of a decoder in a receiver, is determined. R is set to be greater than Rmin.

In real system implementation, Rmax and Rmin are preset. In some sense, Rmax is the code rate of the sub-codes to be generated and Rmin is a target code rate after code combining of the sub-codes. In general, Rmin is the code rate of an encoder in the transmitter.

In step 403, the number of sub-codes (S) is calculated by the following equation using Rmax and Rmin. Here, the number of the sub-codes or the number of puncturing matrixes is a minimum integer exceeding the ratio of Rmax to Rmin.

$$S = \lceil R_{max}/R_{min} \rceil \quad (2)$$

where $\lceil * \rceil$ represents a minimum integer equal to or larger than *.

A variable m is set to an initial value of 1 in step 405 and C (=m×n) is determined in step 407. C is the number of the columns of each puncturing matrix, determined by Rmax. For example, for Rmax=3/4, C can be 3, 6, 9, . . . . and is set to a minimum available value for the first sub-code to be transmitted. Here, C is set to 3 for Rmax=3/4.

In step 407, the number of symbols to be selected from the puncturing matrix Ns is calculated by multiplying the variable m by the code length i.e., the number of code symbols n from Rmax=k/n. Ns is the number of selected symbols or the number of selected positions in each puncturing matrix and calculated by C/Rmax.

In step 409, (Ns−C) is compared with the number of the component encoders of the turbo encoder in the transmitter. The present turbo encoder is generally provided with two component encoders. Thus, it is assumed that two component encoders are used. It is determined whether (Ns−C) is 2 or greater in step 409 because the turbo encoder has two component encoders connected in parallel with the interleaver interposed as shown in FIG. 2 unlike conventional encoders using other single codes. In other words, at least one parity symbol from each component encoder must be transmitted after the information symbols are all transmitted in order to preserve the characteristics inherent in the turbo encoder.

If (Ns−C) is less than 2, at least one symbol is selected from either the first parity symbol set or the second parity symbol set. From the perspective of turbo codes, either case may face problems. Sub-codes generated without second parity symbols are not turbo codes but convolutional codes with constraint length K=4 from an encoder having only the first component encoder and offers no interleaver gain that is available in the turbo encoder. On the other hand, transmission of only systematic symbols without parity symbols from the first component encoder results in sub-codes with a code rate of 1. This is equivalent to an uncoded system without any coding gain. Accordingly, (Ns−C) must be equal to or greater than 2 to provide turbo encoder performance.

If (Ns−C) is equal to or greater than 2 in step 409, C systematic information symbols are selected from the puncturing matrix in step 411 and the other symbols are selected according to a predetermined type. For type 1, the other symbols are selected from the first and second parity symbols by Eq. (3) in step 413. The number of selected first parity symbols is equal to or greater than that of selected second parity symbols. For example, if the number of the other symbols (Ns−C) is 3, first and second parity symbols are selected by Eq. (3) and then one more symbol is selected from the second parity symbols.

$$\lceil (Ns-C)/2 \rceil ENC1(parity)$$

$$\lfloor (NS-C)/2 \rfloor ENC2(parity) \quad (3)$$

where $\lfloor * \rfloor$ represents a maximum integer equal to or less than *.

For type 2, the other symbols are selected from the first and second parity symbols by Eq. (4) in step 415. If a and b are given as symbol distribution rates for the first parity symbols and the second parity symbols, respectively, as many symbols as a minimum integer equal to or larger than the ratio of a(Ns−C) to (a+b) are selected from the first parity symbols and as many symbols as a maximum integer equal to or less than the ratio of b(Ns−C) to (a+b) are selected from the second parity symbols.

$$\lceil a(Ns-C)/(a+b) \rceil ENC1(parity)$$

$$\lfloor b(Ns-C)/(a+b) \rfloor ENC2(parity) \quad (4)$$

where a+b=1 and a and b indicate the symbol distribution rates for ENC1 and ENC2, respectively.

If the condition given in step 409 is not satisfied, that is, (Ns−C) is less than 2, the variable m is incremented by 1 in step 417 and the procedure returns to step 407. The purpose of step 409 is to determine whether sub-codes capable of preserving the nature of turbo codes can be generated within the present puncturing range (the size of the puncturing matrix). If the nature of the turbo codes cannot be preserved, the puncturing range is enlarged in step 417.

As described above, the initial puncturing matrix is so constructed that all information symbols are selected and at least one symbol is selected from each of the first and second parity symbol sets in the turbo encoder.

Now there will be given a description of a middle puncturing matrix generation method referring to FIG. 8. By repeating the procedure of FIG. 8, puncturing matrixes $C_1$ to $C_{s-2}$ are generated.

Referring to FIG. 8, step 501 or 503 is performed according to a predetermined type. For type 1, Ns symbols are selected from the first and second parity symbol sets by Eq. (5) in step 501. Ns is the product of m and n given from Rmax (=k/n) where k is the number of information symbols for making n code symbols. The number of selected first parity symbols is equal to or greater than that of selected second parity symbols. Here, unselected symbols are selected from the previous puncturing matrixes.

$$\lceil Ns/2 \rceil ENC1(parity)$$

$$\lfloor Ns/2 \rfloor ENC2(parity) \quad (5)$$

For type 2, Ns symbols are selected from the first and second parity symbol sets according to predetermined rates by Eq. (6) in step 503. If a and b are given as symbol distribution rates for the first parity symbols and the second parity symbols, respectively, as many symbols as a minimum integer equal to or greater than the ratio of a(Ns) to (a+b) are selected from the first parity symbols and as many symbols as a maximum integer equal to or less than the ratio of b(Ns) to (a+b) are selected from the second parity symbols. Here, unselected symbols are selected from the previous puncturing matrixes.

$$\lceil a(Ns)/(a+b) \rceil ENC1(parity)$$

$$\lfloor b(Ns)/(a+b) \rfloor ENC2(parity) \quad (6)$$

A last puncturing matrix $C_{s-1}$ generating method will be described below referring to FIG. 9.

Referring to FIG. 9, the remaining unselected symbols are all selected from the previous puncturing matrixes in step 601. The number of the selected symbols is defined as Ns2. In step 603, a new Ns is defined by (Ns−Ns2). Since symbols at all positions are selected from the puncturing matrixes in the process of the operations shown in FIGS. 7, 8 and 9, the new Ns is the number of symbols to be repeatedly selected. In step 605, it is determined whether the new Ns is greater than 0. If the new Ns is 0, the procedure ends. If it is greater than 0, as many symbols as the new Ns are selected from the information symbols. In other words, the selected symbols are retransmitted.

The above-described sub-code generation method according to the present invention will be made clear below with specific numerical citations.

For Rmax=3/4 and R=1/5, Rmin=1/6 and S=6/(4/3)=4.5→5. Thus, five puncturing matrixes are produced.

$\{C_0, C_1, C_2, C_3, C_4\}$: Rmax=3/4.

Since the code rate of sub-codes is 3/4 and the number of sub-codes is 5, the sub-codes have a code rate 3/20 ((1/S)× Rmax=(1/5)×(3/4)=3/20) after code combining. This implies that for 3 information bits, a receiver receives 20 code symbols. However, since 15 symbols are generated from S×b=5× 4=20 and S×a=5×3=15, a predetermined 5 symbols among the 15 symbols are repeatedly transmitted. The repeated symbols are preferably information symbols. In the above example, if an information symbol X is repeated once in each sub-code, a decoder receives turbo codes with R=1/5 in which information symbols occur twice for each of S sub-codes.

3. Redundancy Selection (Quasi-Complementary Code Set)

The resulting sub-codes from the procedures shown in FIGS. 7, 8 and 9 are a kind of complementary codes, although they are not in a strict sense of the term because repeated symbols exist and each sub-code exhibits a different characteristic. In view of the sub-codes being produced from turbo codes, they will be called quasi-complementary turbo codes (QCTCs). An HARQ system employs the following retransmission scheme using QCTCs.

The HARQ system is the major example using packet code combining. Packet code combining is available to the present HARQ systems, HARQ type I, Type II, and Type III. In these systems, a retransmission technique can be implemented using QCTCs. If a transport unit (TU) is defined as an information bit block being a basic unit for packet transmission, one sub-code $C_i$ is selected for each TU transmission in the hybrid systems.

A retransmission unit and an initial transmission TU can be the same or different in size. For every transmission, the following QCTC set is used.

From a QCTC $C_q$ having a code set size S, a mother code C can be reconstructed, or a new code Cq with a lower code rate than the mother code C can be generated by combining (or code-combining) sub-codes $C_i$ (i=0, 1, 2, . . . ,S−1). The mother code has a minimum code rate available in the encoder. Then, the QCTC is defined as Original code C with code rate R=Rm or code C with code rate $$R < Rm = \bigcup_{i=0}^{S-1} C_i \quad (7)$$

where S is the number of sub-codes with a code rate of Ri and Rm is the mother code rate.

The operation of a system transmitting TUs of the same size for an initial transmission and each retransmission using a QCTC will be described. Needless to say, the transmission scheme using different TUs can also be supported in the present invention. Here, S is 4 and R is 1/5.

(Step 1) Transmission is performed on a TU basis and a sub-code $C_i$ of the QCTC is transmitted at the initial transmission and each retransmission.

(Step 2) When the overall code rate of codes produced by soft combining of the initially transmitted and retransmitted packets is greater than 1/5, each sub-code $C_i$ of the QCTC is transmitted in the order of $C_0, C_1, C_2, \ldots, C_{S-1}$ at each retransmission request. This is packet code combining.

(Step 3) When the overall code rate of codes produced by soft combining of the initially transmitted and retransmitted packets is less than or equal to 1/5, each sub-code $C_i$ of the QCTC is repeatedly transmitted in the order of $C_0, C_1, C_2, \ldots, C_{S-1}$ at each retransmission request. This is packet diversity combining.

(Step 4) The QCTC set size can be an arbitrary value, determined by Rmax and Rmin. For R=1/5 and a sub-code code rate of 2/3 for retransmission, up to four sub-codes can be used.

Table 3 below lists QCTC sets for forward traffic channel packet data rates that are expected to be available in the present IS-2000 1XEVDV system. Here, a mother code rate R=1/5 and a sub-code code rate R=2/3, 1/3, or 1/6.

TABLE 3

| Set size S | Code set | Subcode rate set | Data rates |
|---|---|---|---|
| 1 | $\{C_0\}$ | $C_0: R_0 = 1/6$ | 307.2 kbps |
|  |  |  | 153.6 kbps |
|  |  |  | 76.8 kbps |
|  |  |  | 38.4 kbps |
|  |  |  | 19.2 kbps |
| 2 | $\{C_0, C_1\}$ | $C_0: R_0 = 1/3$ | 1228.8 kbps |
|  |  | $C_1: R_1 = 1/3$ | 921.6 kbps |
|  |  |  | 614.4 kbps |
|  |  |  | 307.2 kbps |
| 4 | $\{C_0, C_1, C_2, C_3\}$ | $C_0: R_0 = 2/3$ | 2457.6 kbps |
|  |  | $C_1: R_1 = 2/3$ | 1843.2 kbps |
|  |  | $C_2: R_2 = 2/3$ | 1228.8 kbps |
|  |  | $C_3: R_3 = 2/3$ |  |

As shown in Table 3, for a sub-code code rate of 1/6 less than the mother code rate 1/5, the same code $C_0$ is used at each transmission. For a sub-code code rate of 1/3, greater than the mother code rate 1/5, a different code $C_0$ and $C_1$ is used at each transmission. In this case, the code set size S is 2. For a sub-code code rate of 2/3, greater than the mother code rate 1/5, a different code $C_0, C_1, C_2, C_3$ is used at each transmission. The code set size S is 4. When S sub-codes are all transmitted, the receiver can recover the mother code rate R and obtain the maximum coding gain offered by the encoder.

4. Puncturing Matrix for Quasi-Complementary Codes

Below, Table 4 illustrates examples of a puncturing matrix for each sub-code code rate.

TABLE 4

| Code rates | $C_0$ | $C_1$ | $C_2$ | $C_3$ |
|---|---|---|---|---|
| R = 1/6 | $\begin{vmatrix} X \\ Y0 \\ Y1 \\ Y'0 \\ Y'1 \end{vmatrix} = \begin{vmatrix} 2 \\ 1 \\ 1 \\ 1 \\ 1 \end{vmatrix}$ | NA | NA | NA |

TABLE 4-continued

| Code rates | $C_0$ | $C_1$ | $C_2$ | $C_3$ |
|---|---|---|---|---|
| R = 1/3 | $\begin{vmatrix} 1 \\ 1 \\ 0 \\ 1 \\ 0 \end{vmatrix}$ | $\begin{vmatrix} 1 \\ 1 \\ 0 \\ 1 \\ 0 \end{vmatrix}$ | NA | NA |
| R = 2/3 | $\begin{vmatrix} 0 & 1 \\ 1 & 0 \\ 0 & 0 \\ 0 & 1 \\ 0 & 0 \end{vmatrix}$ | $\begin{vmatrix} 1 & 0 \\ 0 & 1 \\ 0 & 0 \\ 1 & 0 \\ 0 & 0 \end{vmatrix}$ | $\begin{vmatrix} 0 & 1 \\ 0 & 0 \\ 1 & 0 \\ 0 & 0 \\ 0 & 1 \end{vmatrix}$ | $\begin{vmatrix} 1 & 0 \\ 0 & 0 \\ 0 & 1 \\ 0 & 0 \\ 1 & 0 \end{vmatrix}$ |
| R = 2/3 | $\begin{vmatrix} 1 & 1 & 1 & 1 \\ 1 & 0 & 0 & 0 \\ 0 & 0 & 0 & 0 \\ 0 & 0 & 1 & 0 \\ 0 & 0 & 0 & 0 \end{vmatrix}$ | $\begin{vmatrix} 0 & 0 & 0 & 0 \\ 0 & 1 & 1 & 1 \\ 0 & 0 & 0 & 0 \\ 1 & 1 & 0 & 1 \\ 0 & 0 & 0 & 0 \end{vmatrix}$ | $\begin{vmatrix} 0 & 0 & 0 & 0 \\ 0 & 0 & 0 & 0 \\ 1 & 1 & 0 & 1 \\ 0 & 0 & 0 & 0 \\ 0 & 1 & 1 & 1 \end{vmatrix}$ | $\begin{vmatrix} 1 & 1 & 1 & 1 \\ 0 & 0 & 0 & 0 \\ 0 & 0 & 1 & 0 \\ 0 & 0 & 0 & 0 \\ 1 & 0 & 0 & 0 \end{vmatrix}$ |

As shown in Table 4, when a rate 1/5 turbo code is used as a mother code and a rate 2/3 sub-code is generated with code symbols output for 4 information bits, 20 code symbols are generated from the 4 information bits. The rate 2/3 sub-code is generated by puncturing 14 symbols among the 20 symbols. For packet diversity combining of such sub-codes, $C_0$ produced from the above puncturing matrixes is repeatedly transmitted at each retransmission request. On the other hand, for packet code combining, a different code symbol is transmitted at each retransmission request. After transmitting all sub-codes $C_0$, $C_1$, $C_2$, $C_3$ in the set, the packet diversity combining is executed. For HARQ Type III using packet code combining, full code symbols of the mother code are decoded after four transmissions occur.

Meanwhile, "1"s in the puncturing matrixes of Table 4 indicate that the symbols at the positions are selected or transmitted and "0"s indicate that the symbols at the positions are punctured. A "2" indicates that the symbol at the position occurs twice. The puncturing (and repetition) matrixes are designed to satisfy the following conditions.

(Condition 1) An information symbol X is repeated in a sub-code of a QCTC when repetition is used.

(Condition 2) If the information symbol X is repeated in a sub-code of the QCTC using repetition, the repeating period is set to be a minimal constant in the QCTC having all sub-codes in combination.

(Condition 3) If puncturing is used, redundancy symbols except the information symbol X are punctured if possible in the sub-codes of the QCTC.

(Condition 4) If puncturing is used, redundancy symbols except the information symbol X are uniformly punctured if possible in the sub-codes of the QCTC.

A puncturing and repetition matrix with R=1/6 satisfying the above conditions will be described. Decoding is carried out after the symbols X that occur twice are soft-combined and so the real code rate for the decoder is 1/5.

The rate 1/5 code, having the energy of the information symbol X increased, has an improved performance, as compared to a rate 1/5 code having a uniform symbol energy across the symbols. In other words, the most appropriate symbol to be repeated is an information symbol. It can be said that the puncturing and repetition matrixes shown in Table 4 are constructed in such a way that information symbol energy is increased through uniform repetition of the information symbols.

In Table 4, for R=1/6, the sequence of transmission code symbols is given as $C_0$: X, X, Y0, Y1, Y'0, Y'1, X, X, Y0, Y1, Y'0, Y'1, ...

Because six code symbols are generated for the input of one information symbol, the code rate of the sub-code is 1/6. Concerning the puncturing and repetition matrix with R=1/6, decoding is carried out after the symbols X that occur twice are soft-combined and so the real code rate for the decoder is 1/5. The rate 1/5 code, having the energy of the information symbol X increased, has an improved performance, as compared to a rate 1/5 code having a uniform symbol energy across the symbols. In other words, the most appropriate symbol to be repeated is an information symbol. It can be said that the puncturing and repetition matrix with R=1/6 shown in Table 4 is constructed in such a way that information symbol energy is increased through uniform repetition of the information symbols.

For R=1/3, the sequence of transmission code symbols are given as $C_0$: X, Y0, Y'0, X, Y0, Y'0, X, Y0, Y'0, X, Y0, Y'0, ...

$C_1$: X, Y1, Y'1, X, Y1, Y'1, X, Y1, Y'1, X, Y1, Y'1, ...

Because three code symbols are generated for the input of one information symbol, the code rate of the sub-code is 1/3. A different code is transmitted at each transmission due to the use of a different puncturing matrix. After soft combining of $C_0$ and $C_1$, X occurs twice and each of Y0, Y1, Y'0 and Y'1 occurs once. The decoder with a code rate 1/5 can be used in this case and the puncturing matrixes satisfy the above-described conditions, ensuring performance.

In the first case with R=2/3 shown in Table 4, the sequence of transmission code symbols are given as $C_0$: Y0, X, Y'0, Y0, X, Y'0, Y0, X, Y'0, Y0, X, Y'0, ...

$C_1$: X, Y'0, Y0, X, Y'0, Y0, X, Y'0, Y0, X, Y'0, Y0, ...

$C_2$: Y1, X, Y'1, Y1, X, Y'1, Y1, X, Y'1, Y1, X, Y'1, ...

$C_3$: X, Y'1, Y1, X, Y'1, Y1, X, Y'1, Y1, X, Y'1, Y1, ...

Because three code symbols are generated for the input of two information symbols, the code rate of the sub-code is 2/3. A different code is transmitted at each transmission due to the use of a different puncturing matrix. After soft combining of $C_0$, $C_1$, $C_2$, $C_3$, X occurs twice and each of Y0, Y1, Y'0 and Y'1 occurs once. The decoder with a code rate 1/5 can be used also in this case as for R=1/6 and the puncturing matrixes satisfy the above-described conditions, ensuring performance.

In the second case with R=2/3 shown in Table 4, the sequence of transmission code symbols are given as $C_0$: X, Y0, X, X, Y'0, X, X, Y0, X, X, Y'0, X, X, Y0, X, X, Y'0, X, ...

$C_1$: Y'0, Y0, Y'0, Y0, Y0, Y'0, Y'0, Y0, Y'0, Y0, Y0, Y'0, ...

$C_2$: Y1, Y1, Y'1, Y'1, Y1, Y'1, Y1, Y1, Y'1, Y'1, Y1, Y1'1, ...

$C_3$: X, Y'1, X, X, Y'1, X, X, Y'1, X, X, Y'1, X, ...

Because six code symbols are generated for the input of four information symbols, the code rate of the sub-code is 2/3. A different code is transmitted at each transmission due to the use of a different puncturing matrix. After soft combining of $C_0$, $C_1$, $C_2$, $C_3$, X occurs twice and each of Y0, Y1, Y'0 and Y'1 occurs once. The decoder with a code rate 1/5 can be used also in this case as for R=1/6 and the puncturing matrixes satisfy the above-described conditions, ensuring performance.

5. Transmission Protocol

Since a packet transmission protocol applies to both a forward traffic channel and a reverse traffic channel in adopting HARQ Type III for traffic channels, the bi-directional traffic channels will be termed just traffic channels collectively unless there is a need for discriminating them.

5.1. Relationship between Transmission Packet Length and Physical Channel

Packet length is variable in transmitting packets on traffic channels by HARQ Type III. One packet to be transmitted is defined as a physical layer packet (PLP). One PLP may include a plurality of sub-packets called TUs and each TU is also variable in length. Thus, PLP length is variable. Needless to say, one TU can be transmitted in one PLP.

An HARQ Type III protocol will be described below in connection with two main cases. A packet is TU, 2TU, 3TU or 4TU in length and each TU has at least 768 or 1536 bits. A packet with TU=768 is called a short format and a packet with TU=1536, a long format. The maximum number of TUs for a PLP is variable, determined according to a data rate on a physical transmission channel. It is assumed here that four TUs are transmitted in one PLP.

One PLP is transmitted on a slot basis. The number of data per slot is variable from 1 to any number, determined by the data rate available from the physical transmission channel. In other words, the number of slots is determined according to the data rate for a PLP. By way of example, two cases are considered: a packet transmitted in a short format with 1 to 32 slots and a packet transmitted in a long format with 2 to 64 slots. This kind of classification is equivalent to the discrimination between TU=768 and TU=1536. On the assumption that a PLP with TU=768 is transmitted in up to 16 slots, the PLP with the TU length is defined as a short format. On the other hand, a PLP with TU=1536 transmitted in up to 32 slots is defined as a long format. The definitions are made based on packet length and have no fundamental relation to the implementation of the HARQ Type III protocol. Yet, they influence the packet length-related system throughput.

5.2. Error Detection from Transmitted Traffic and Retransmission Method

Each TU in a single PLP has an independent error correction code. Therefore, errors can be detected from each TU or from all TUs in one PLP using one error correction code before a retransmission request can be issued. In reality, a receiver determines whether errors are detected from a received packet and reports the determination result to a transmitter on a PLP basis. However, a retransmitted PLP may have a different TU constitution depending on whether individual TUs have errors in the PLP.

Figure 3:
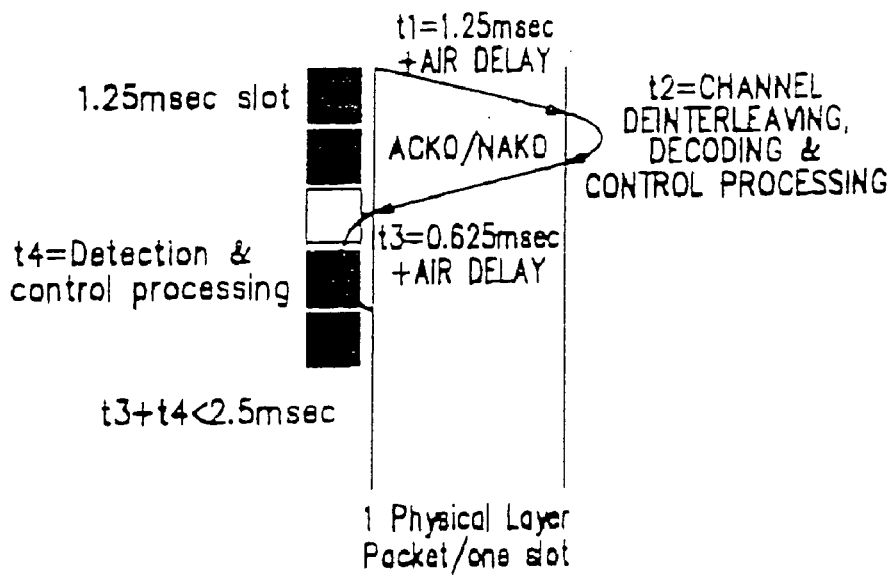
FIG. 3 illustrates an embodiment of packet transmission by HARQ according to the present invention.

FIG. 3 illustrates an HARQ transmission scheme for a PLP occupying one slot. As shown in FIG. 3, one PLP is interlaced with adjacent three slots for transmission. A different packet can be transmitted in each of four slots and an independent signal ACK/NACK is transmitted on a reverse channel for each packet. In this structure, each PLP may follow an independent Stop-and-Wait ARQ (SW-ARQ) protocol and a predetermined reverse control signal is always transmitted from the receiver to the transmitter. This structure is defined as "modulo N HARQ" and the number of interlaced slots is determined by N. N=4 in FIG. 3. One user can use the interlaced slots and in this case, each slot is available for PLP transmission. However, the HARQ Type III protocol for the user operates as the Selective Repeat-ARQ (SR-ARQ) and a memory for storing data received in four slots (N=4) must be provided for a physical channel in the receiver. Here, a description will be confined to SW-ARQ without the memory requirement, while the same description is valid to SW-ARQ requiring such a memory capacity.

Figure 4:
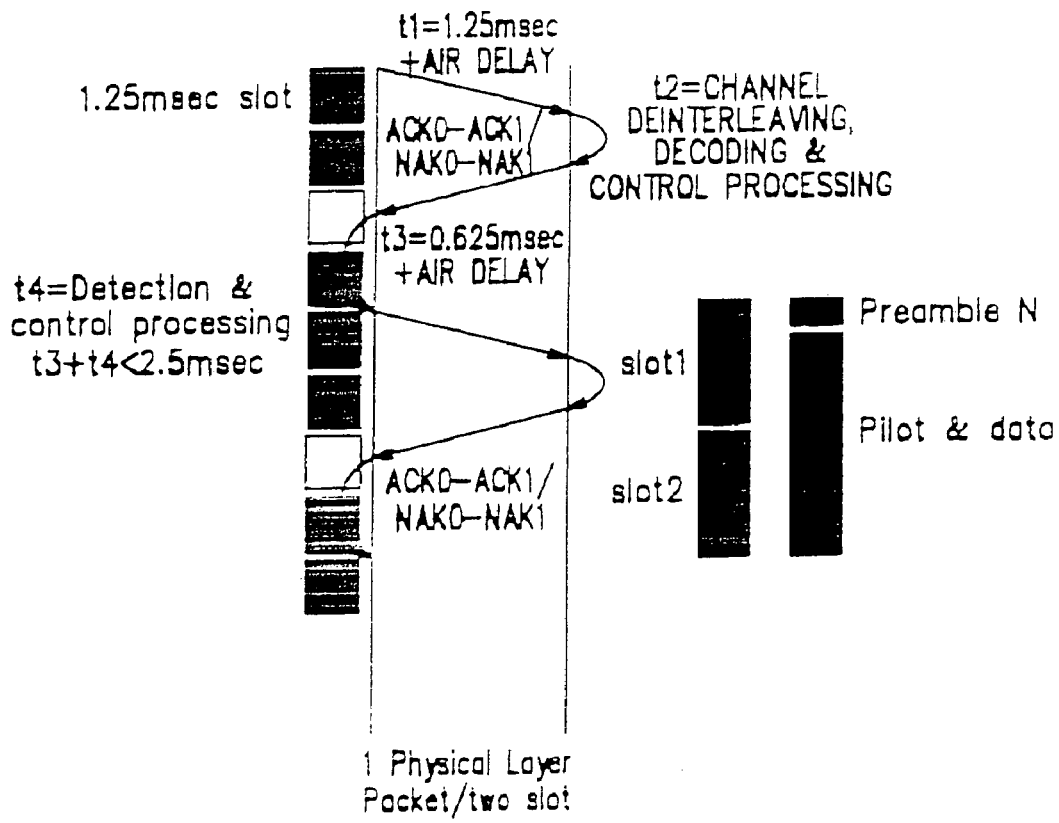
FIG. 4 illustrates another embodiment of packet transmission by HARQ according to the present invention.

FIG. 4 illustrates an HARQ transmission scheme for a PLP occupying two slots. As shown in FIG. 4, one PLP is transmitted in two slots interlaced with adjacent three slots. Therefore, the receiver can recover one full PLP after receiving two slots. A different packet can be transmitted in each of four slots and an independent signal ACK/NACK is transmitted for the packet on a reverse channel. Therefore, each PLP follows an independent SW-ARQ protocol and a predetermined reverse control signal is transmitted from the receiver to the transmitter in this so-called "modulo N HARQ" structure. The number of interlaced slots is determined by N.

If NACK is detected from at least one of ACK/NACK indicator bits, the transmitter transmits a retransmission-requested PLP using a quasi-complementary code set shown in Table 5 and Table 6 on a forward traffic channel. Various ACK/NACK combinations can be made from a plurality of ACK/NACK indicator bits and in each case, the transmitter can include TUs in a retransmitted PLP also in various ways. In general, TU transmission must satisfy the following conditions.

(Condition 1) No TUs with ACK are retransmitted.

(Condition 2) TUs with NACK are retransmitted with priority and their transmission priorities depend on their QoS (Quality of Service).

(Condition 3) If the total number of bits available for slots of a retransmitted PLP exceeds the number of bits for TUs with NACK, TUs with higher priorities determined according to Condition 2 are repeatedly transmitted in the first place.

(Condition 4) If QoS must be preserved for each TU, a weight is given to the TU to maintain the QoS in retransmission. For example, if QoS for TU0, TU1, TU2, and TU3 are QoS0, QoS1, QoS2 and QoS3 in a PLP having the four TUs, (QoS0+QoS1+QoS2+QoS3)=1.0, and only TU0 is received with ACK and TU1, TU2 and TU3 are received with NACK, the QoS is set for retransmission as follows.

QoS1=QoS1×(1/(QoS0+QoS1+QoS2)) where (QoS0+QoS1+QoS2)<0

QoS2=QoS2×(1/(QoS0+QoS1+QoS2)) where (QoS0+QoS1+QoS2)<0

QoS3=QoS3×(1/(QoS0+QoS1+QoS2)) where (QoS0+QoS1+QoS2)<0

To generalize the above QoS determination process, if one PLP has P TUs, TU0, TU1, TU2, . . . , TU(P−1) and TU(i), TU(j), . . . , TU(s) are received with NACK (here, i, j, . . . , s∈{0, 1, 2, 3, 4, . . . , P−1}, weights for retransmitted TUs are calculated by $$QoS(i) = QoS(i) \times (1/(QoS(i) + QoS(j) + \ldots + QoS(s)))$$
where $(QoS(i) + QoS(j) + \ldots + QoS(s)) < 0$ $$QoS(j) = QoS(j) \times (1/(QoS(i) + QoS(j) + \ldots + QoS(s)))$$
where $(QoS(i) + QoS(j) + \ldots + QoS(s)) < 0$ $$\vdots$$

$$QoS(s) = QoS(s) \times (1/(QoS(i) + QoS(j) + \ldots + QoS(s)))$$
where $(QoS(i) + QoS(j) + \ldots + QoS(s)) < 0$ to thereby reset the number of transmission bits.

Only when all the ACK/NACK indicator bits received on a reverse ACK channel indicate ACK, a new PLP is transmitted on the forward traffic channel.

5.3. Transmission Code Selection for Traffic Channel

A PLP is encoded using a quasi-complementary code for each transmission on a traffic channel. For an initial transmission, $C_0$ is used from a complementary code set with a set size S determined according to a PLP data rate for the traffic channel in Table 5 and Table 6. Then, every time NACK is received on the reverse ACK channel, codes are selected in the circulating order of $C_1, C_2, \ldots, C_{S-1}, C_0, C_1, \ldots$ for the traffic channel.

6.1. Periodical Transmission of ACK/NACK signal on Reverse ACK Channel

In the inventive HARQ scheme, a predetermined ACK/NACK transmission period is used irrespective of an SR-ARQ or SW-ARQ protocol and the ACK/NACK signal period is determined according to the traffic data rate. Since

TABLE 5

| Data Rates (kbps) | Slots/ PLP | TU/ PLP | Code Rate | Repetition | ACK/NACK Period (slots) | ACK Indicator Bits/Reverse ACK Channel | Quasi Complementary Code Set |
|---|---|---|---|---|---|---|---|
| 19.2    | 32 | 1 | 1/6 | 16 | 2 × 4 | 1 | {$C_0$} |
| 38.4    | 16 | 1 | 1/6 | 8  | 2 × 4 | 1 | {$C_0$} |
| 76.6    | 8  | 1 | 1/6 | 4  | 2 × 4 | 1 | {$C_0$} |
| 153.6   | 4  | 1 | 1/6 | 2  | 2 × 4 | 1 | {$C_0$} |
| 307.2   | 2  | 1 | 1/6 | 1  | 2 × 4 | 1 | {$C_0$} |
| 614.4   | 1  | 1 | 1/3 | 1  | 1 × 4 | 1 | {$C_0, C_1$} |
| 307.2   | 4  | 2 | 1/3 | 2  | 2 × 4 | 2 | {$C_0, C_1$} |
| 614.4   | 2  | 2 | 1/3 | 1  | 2 × 4 | 2 | {$C_0, C_1$} |
| 1228.8  | 1  | 2 | 2/3 | 1  | 1 × 4 | 2 | {$C_0, C_1, C_2, C_3$} |
| 921.6   | 2  | 3 | 1/3 | 1  | 2 × 4 | 3 | {$C_0, C_1$} |
| 1843.2  | 1  | 3 | 2/3 | 1  | 1 × 4 | 3 | {$C_0, C_1, C_2, C_3$} |
| 1228.8  | 2  | 4 | 1/3 | 1  | 2 × 4 | 4 | {$C_0, C_1$} |
| 2457.6  | 1  | 4 | 1/3 | 1  | 1 × 4 | 4 | {$C_0, C_1, C_2, C_3$} |

TABLE 6

| Data Rates (kbps) | Slots/ PLP | TU/ PLP | Code Rate | Repetition | ACK/NACK Period (slots) | ACK Indicator Bits/Reverse ACK Channel | Quasi Complementary Code Set |
|---|---|---|---|---|---|---|---|
| 19.2    | 32 | 1 | 1/6 | 16 | 2 × 8 | 1 | {$C_0$} |
| 38.4    | 16 | 1 | 1/6 | 8  | 2 × 8 | 1 | {$C_0$} |
| 76.6    | 8  | 1 | 1/6 | 4  | 2 × 8 | 1 | {$C_0$} |
| 153.6   | 4  | 1 | 1/6 | 2  | 2 × 8 | 1 | {$C_0$} |
| 307.2   | 2  | 1 | 1/6 | 1  | 2 × 8 | 1 | {$C_0$} |
| 614.4   | 1  | 1 | 1/3 | 1  | 1 × 8 | 1 | {$C_0, C_1$} |
| 307.2   | 4  | 2 | 1/3 | 2  | 2 × 8 | 2 | {$C_0, C_1$} |
| 614.4   | 2  | 2 | 1/3 | 1  | 2 × 8 | 2 | {$C_0, C_1$} |
| 1228.8  | 1  | 2 | 2/3 | 1  | 1 × 8 | 2 | {$C_0, C_1, C_2, C_3$} |
| 921.6   | 2  | 3 | 1/3 | 1  | 2 × 8 | 3 | {$C_0, C_1$} |
| 1843.2  | 1  | 3 | 2/3 | 1  | 1 × 8 | 3 | {$C_0, C_1, C_2, C_3$} |
| 1228.8  | 2  | 4 | 1/3 | 1  | 2 × 8 | 4 | {$C_0, C_1$} |
| 2457.6  | 1  | 4 | 1/3 | 1  | 1 × 8 | 4 | {$C_0, C_1, C_2, C_3$} |

If three consecutive NACKs are received on the reverse ACK channel, sub-codes are used in the order of $C_1$, $C_2$, and $C_3$ for the forward traffic channel. If two more NACKs are received, the sub-codes $C_0$ and $C_1$ are used. If ACK is then received, transmission is discontinued and a new PLP is transmitted on the forward traffic channel. The transmitter does not notify the type of the quasi-complementary code for each retransmission but it is known beforehand to both the transmitter and the receiver that the codes are transmitted in the circulating order of $0, 1, 2, \ldots, S-1, 0, 1, \ldots$ according to the set size S determined by the data rates.

6. Structure of Reverse ACK Channel and Transmission on the Channel

The receiver transmits a message indicating whether an error is detected for each received PLP on the reverse ACK channel. An ACK/NACK indicator bit is transmitted for each TU of the PLP by an ACK/NACK message. Therefore, if four independent TUs are transmitted on the forward traffic channel, the reverse ACK channel transmits four ACK/NACK bits. That is, as many ACK/NACK bits as TUs are transmitted.

the length of each sub-code transmitted on a traffic channel is one or two slots, a sub-code corresponding to one PLP is always received in two slots at longest. In other words, all codes used for traffic transmission are designed to be completely transmitted in one or two slots. Therefore, an ACK/NACK signal is transmitted in one- or two-slot units with a predetermined interval. Table 3 and Table 4 illustrate sub-codes for data rates.

The ACK/NACK message is transmitted on the reverse ACK channel as specified in Table 5 or Table 6 according to the packet data rate and packet format of a PLP received on a traffic channel and according to whether the PLP occupies interlaced multiple slots. If the PLP uses four interlaced slots in a short format, it can be considered separately in two ways according to its period: four slots (5 msec) and eight slots (10 msec). That is, the receiver time-multiplexes the ACK/NACK message in the first half of the second slot from the traffic reception time. Therefore, the ACK/NACK message is always transmitted one slot after the receiver receives the traffic.

The first ACK/NACK message transmitted on the reverse ACK channel after receiving the PLP on the traffic channel is labeled with ACK/NACK #1. Then, in the case of a four slot period as shown in FIG. 3, each ACK/NACK message is used for early termination regardless of an odd-numbered one or an even-numbered one. The ACK/NACK is also used as a control message for changing a quasi-complementary sub-code for PLP retransmission on the forward traffic channel.

On the other hand, in the case of an eight slot period as shown in FIG. 4, each ACK/NACK message is used for early termination regardless of an odd-numbered one or an even-numbered one and only an even-numbered ACK/NACK message is used as a control message for changing a quasi-complementary sub-code for PLP retransmission.

Early termination refers to discontinuation of slot transmission for a PLP on a traffic channel before all slots assigned to the PLP are transmitted in a situation where the PLP can be received without errors, and then transmission of a new PLP, to thereby increase transmission throughput.

Meanwhile, if the PLP is in a long format, it can also be considered separately in two ways according to its period: 8 slots (10 msec) and 16 slots (20 msec). An odd-numbered ACK/NACK message and an even-numbered ACK/NACK message function in the same way as for the short format.

6.2. Implementation of Transmission Protocol

Figure 5:
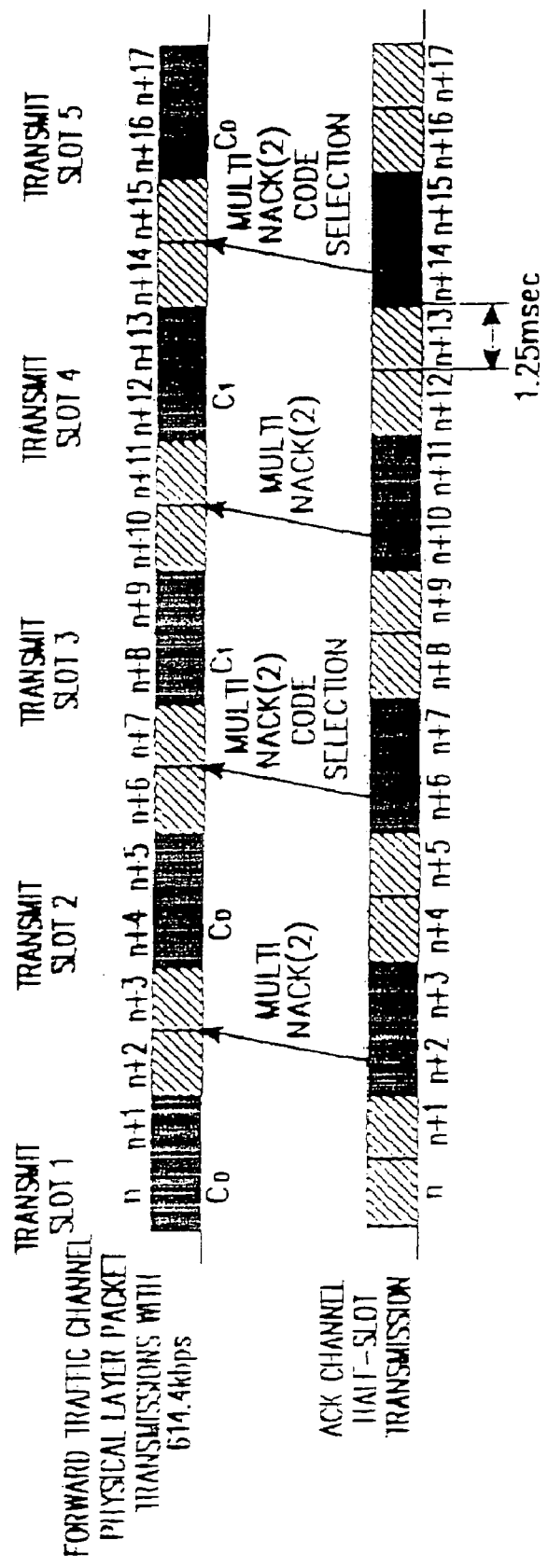
FIG. 5 illustrates slot processing by HARQ in the case of a physical layer packet (PLP) occupying one slot in connection with FIG. 3.
Figure 6:
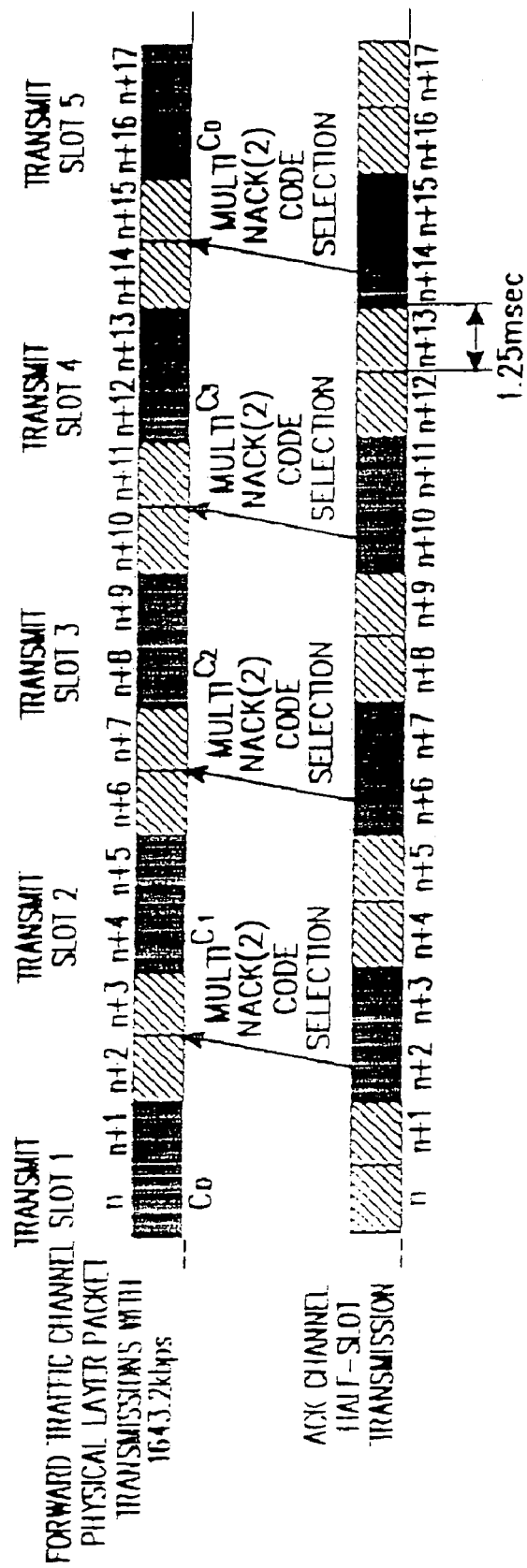
FIG. 6 illustrates slot processing by HARQ in the case of a PLP occupying two slots in connection with FIG. 4.

FIGS. 5 and 6 illustrate forward and reverse slot transmissions according to the present invention. As stated before, transmission of the ACK/NACK message is controlled separately for 1 slot/PLP and 2 slots/PLP for all data rates.

FIG. 5 illustrates slot processing by HARQ for 1 slot/PLP and FIG. 6 illustrates slot processing by HARQ for 2 slots/PLP. They differ in whether a sub-code change for retransmission occurs at an one slot level or at a two slot level.

Figure 10:
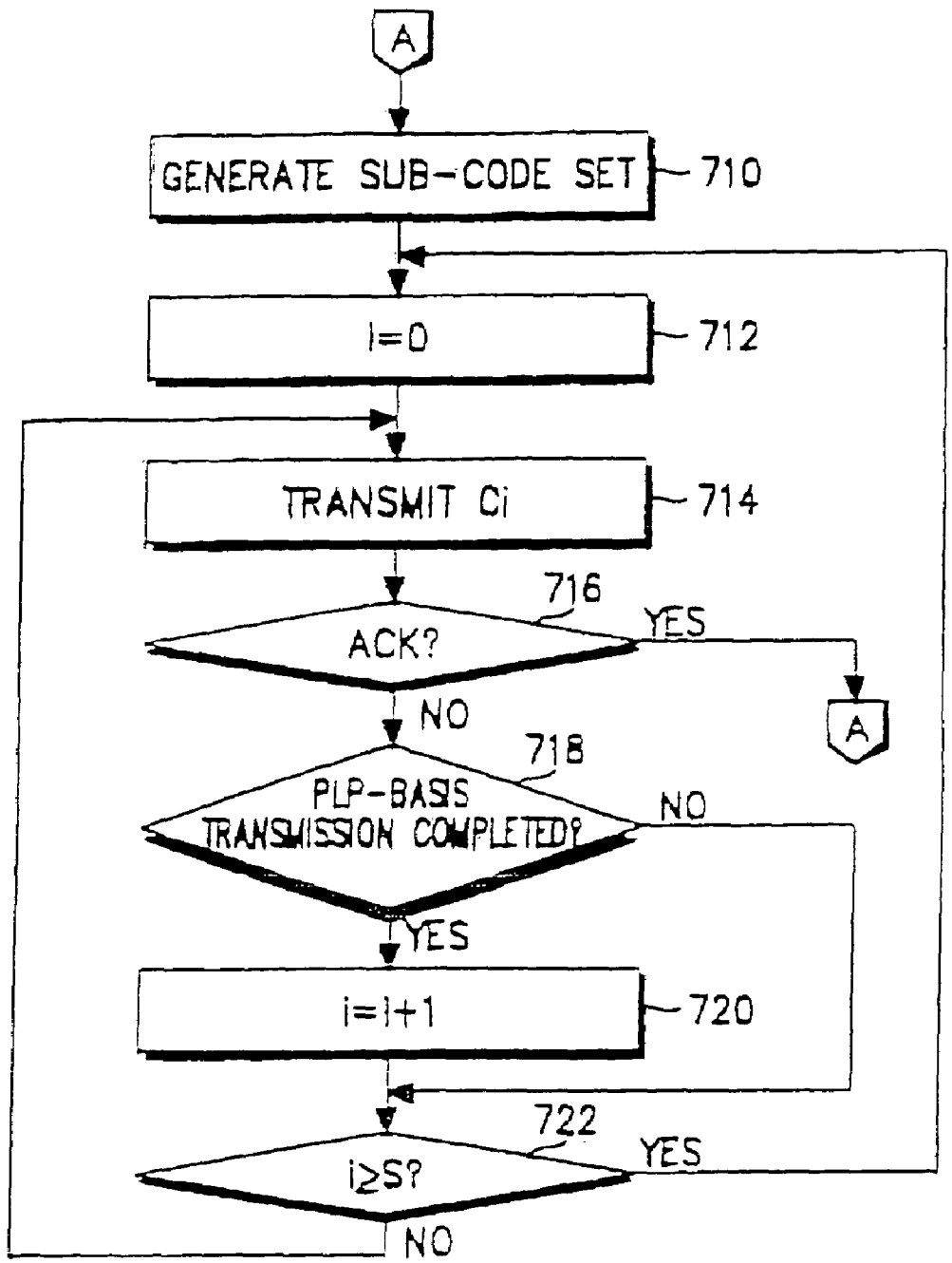
FIG. 10 is a flowchart illustrating a data transmission procedure by HARQ according to the embodiment of the present invention.
Figure 11:
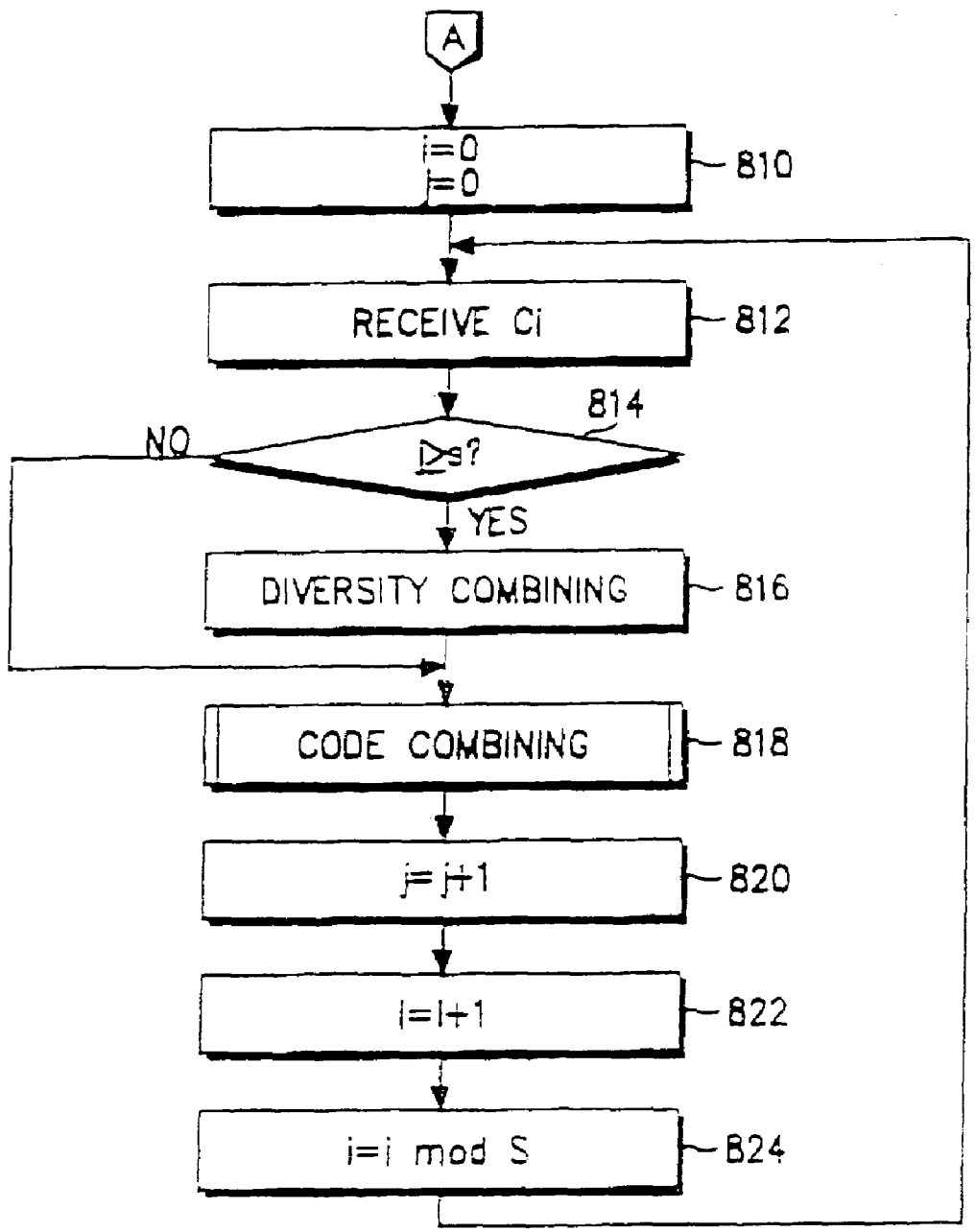
FIG. 11 is a flowchart illustrating a data reception procedure by HARQ according to the embodiment of the present invention.
Figure 12:
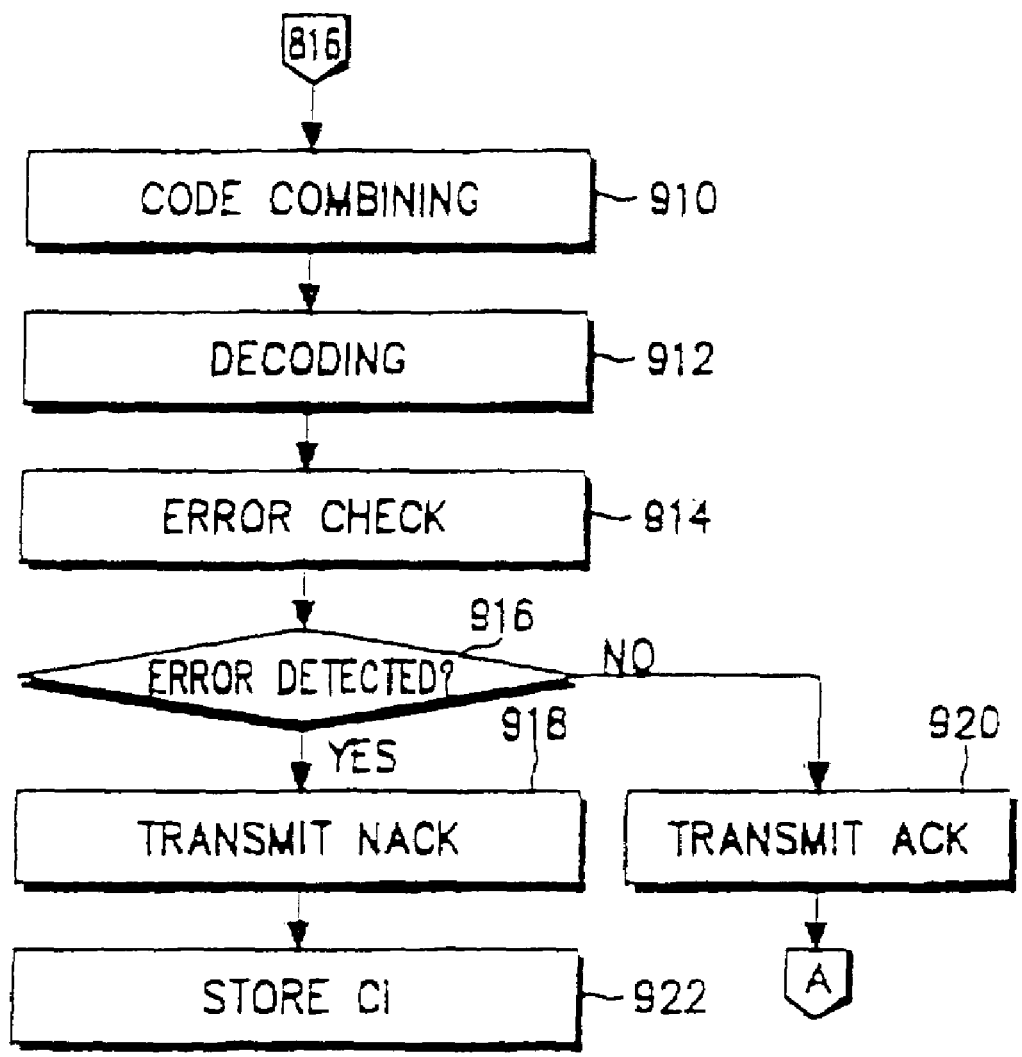
FIG. 12 is a flowchart illustrating a control operation for code combining shown in FIG. 11.

As shown in FIGS. 10, 11 and 12, an ACK/NACK message is transmitted in each slot. FIG. 10 is a flowchart illustrating a control operation for a data transmitting procedure in the transmitter according to the present invention. Referring to FIG. 10, the transmitter generates a sub-code set by encoding a PLP to be transmitted in step 710. For example, the turbo encoder shown in FIG. 2 can be used for generation of the sub-code set. The sub-code set is composed of different sub-codes, the number of which is determined by the sub-code set size. These sub-codes are subject to packet code combining. The detailed operation of generating the sub-code set has been described before with reference to FIGS. 7, 8 and 9.

In step 712, the transmitter sets a count value i to 0 to count the number of transmitted sub-codes. That is, the count value i is used to determine whether all sub-codes of the sub-code set are completely transmitted. The transmitter transmits an ith sub-code $C_i$ in a transmission frame in step 714 and determines whether an ACK signal has been received from the transmitted ith sub-code $C_i$ in step 716. While an ACK message is transmitted for a transmission unit (slot) in the description of steps 714 and 716, the ACK message can be transmitted for a sub-code transmitted in a transmission frame, as stated before. Referring to FIGS. 3 and 4, when one sub-code is transmitted in one slot, the ACK/NACK message is received for each sub-code. The operation of the receiver for transmitting the ACK/NACK message will later be described in detail with reference to FIGS. 11 and 12.

Upon receipt of the ACK message in step 716, the transmitter returns to step 710 where it encodes the next PLP. On the other hand, upon receipt of the NACK message in step 716, which implies that a retransmission of the transmitted PLP is requested, the transmitter determines whether transmission is completed on a PLP basis in step 718. If it is, the transmitter goes to step 720 and otherwise, it goes to step 722.

In step 720, the transmitter increases the count value i by 1 to select the next sub-code to be transmitted, that is, to retransmit the same PLP with a different code. When a PLP is transmitted in a plurality of slots and an ACK/NACK message is received on a slot basis, the sub-code used is not changed until the slots of the PLP are completely transmitted. On the other hand, if the ACK/NACk is received on a PLP basis, steps 714 and 718 can be performed as one step. In other words, since the sub-code $C_i$ is transmitted on a PLP basis, step 718 where it is determined whether the PLP-basis transmission is completed becomes unnecessary.

In step 722, the transmitter determines whether all the sub-codes have been transmitted by comparing the count value i with the total number S of the sub-codes. If i is less than or equal to S, the transmitter returns to step 714, considering that there remain sub-codes to be transmitted. In step 714, the transmitter transmits the next sub-code. Meanwhile, if i is greater than S in step 722, the transmitter returns to step 712 considering that all the sub-codes have been transmitted, resets the count value i to 0, and repeats the retransmission operation of the sub-codes. In this manner, the original sub-codes are retransmitted so that the receiver performs packet diversity combining on the received sub-codes.

As described above, since different sub-codes are sequentially transmitted upon receipt of retransmission requests, each of the different sub-codes can be considered a PLP. For example, if the sub-code set includes sub-codes $C_0$, $C_1$, $C_2$, ..., $C_{S-1}$, the transmitter first transmits the sub-code $C_0$ to the receiver. If the receiver receives the sub-code $C_0$ successfully, it prepares for reception of the next PLP. On the contrary, if the receiver fails to receive the sub-code $C_0$ successfully, it transmits a retransmission request (i.e., an NACK message) for the PLP to the transmitter. Then the transmitter transmits the next sub-code $C_1$ to the receiver. In this context, each transmitted sub-code can be considered the PLP.

Now, a description will be made on a control operation for data reception in the receiver with reference to FIGS. 11 and 12. Referring to FIG. 11, the receiver sets a count value j to 0 to determine whether to perform packet diversity combining and a count value i to 0 to determine whether all sub-codes have been received in step 810. As stated before, the packet diversity combining scheme and the packet code combining scheme are selectively used in the present invention. That is, decoding is carried out by code combining for an initially transmitted PLP and by diversity combining and then code combining for the following PLPs.

The receiver receives a sub-code $C_i$ in step 812 and determines whether the sub-code $C_i$ belongs to the first PLP by comparing the count value j with the total number S of transmission frames in step 814. If j is less than or equal to S, the receiver goes to step 818, considering that the received sub-code belongs to the first PLP. If j is greater than S, the receiver goes to step 816, considering the received sub-code does not belong to the first PLP.

In step 816, the receiver performs packet diversity combining on the received transmission frames, that is, between the sub-code $C_i$ received in the present transmission frame and the previously received sub-code identical to the sub-code $C_i$. For example, if the previous sub-codes are $C_0$, $C_1$, $C_2$, ..., $C_{S-1}$ and the present sub-code is $C_0$, packet diversity combining occurs between the previous sub-code $C_0$ and the present sub-code $C_0$ in step 816.

When j is less than or equal to S, or when the packet diversity combining is completed, the receiver performs code combining in step 818. The code combining operation will be described referring to FIG. 12.

In FIG. 12, the receiver performs packet code combining on the received sub-code $C_i$ in step 910. The code combining is given by $$C_0 \cup C_1 \cup C_2 \ldots \cup C_i \quad (8)$$

As seen from Eq. (8), the code combining is carried out by summing the first to ith sub-codes. Once a code is produced from the packet code combining, the receiver decodes information about the received sub-code using the produced code in step 912 and performs a CRC check on the decoded information in step 914. In step 916, the receiver determines whether the decoded information has an error. If it has an error, the receiver transmits an NACK message equivalent to a retransmission request for the received sub-code to the transmitter in step 918. On the contrary, if the decoding information is error-free, the receiver transmits an ACK message for the received sub-code to the transmitter in step 920 and returns to step 810 to receive the next PLP.

After transmitting the NACK message in step 918, the receiver stores the received sub-code $C_i$ in step 922 and then goes to step 820 in FIG. 11. The receiver increases the count values j and i by 1, respectively in steps 820 and 822. In step 824, the receiver calculates i=i mod S in order to set the count value i to the initial value 0 at the time when all transmission frames have been received and count the number of transmission frames for the next PLP. Therefore, i ranges from 0 to S. Then the receiver returns to step 812 to receive the next sub-code.

The receiver according to the embodiment of the present invention transmits an ACK/NACK message for a received sub-code. When it transmits the ACK message, the receiver receives a sub-code for the next PLP. On the other hand, when it transmits the NACK message, the receiver receives up to S sub-codes for code combining until it can transmit an ACK message for a normal sub-code. If none of the S sub-codes are received successfully, the receiver repeats the same PLP reception operation, performing diversity combining and code combining selectively.

The present invention as described above has the following effects.

(1) The inventive method of generating sub-codes for optimal packet code combining increases transmission throughput remarkably in application of the sub-codes to an HARQ scheme in a mobile communication system that retransmits data using turbo codes.

(2) The selective use of code combining and diversity combining enables efficient data transmission.

(3) Use of soft combining, especially use of packet code combining considering the characteristics of turbo codes improves system throughput in a retransmission scheme of a communication system using turbo codes.

(4) The inventive HARQ scheme with FEC codes and error detection combined increases system performance in a packet communication system using a retransmission scheme or in a typical communication system using a retransmission scheme.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A CDMA (Code Division Multiple Access) mobile communication system comprising:
   a transmitter including a sub-code generator that generates S sub-codes $C_i$ (i=0, 1, 2, ..., S−1) from a PLP (Physical Layer Packet) information stream using quasi-complementary turbo codes, for sequentially transmitting the S sub-codes for initial transmission, and after the initial transmission and upon receipt of retransmission requests, retransmitting the S sub-codes; and
   a receiver for performing diversity combining on same sub-codes among the sub-codes sequentially received from the transmitter and then performing code combining on the received sub-codes.

* * * * *

UNITED STATES PATENT AND TRADEMARK OFFICE
CERTIFICATE OF CORRECTION

PATENT NO.       : 7,609,680 B2  Page 1 of 1
APPLICATION NO.  : 11/209220
DATED            : October 27, 2009
INVENTOR(S)      : Min-Koo Kim It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1098 days.

Signed and Sealed this

Twelfth Day of October, 2010

David J. Kappos
*Director of the United States Patent and Trademark Office*